(12) United States Patent
Singh et al.

(10) Patent No.: US 6,406,976 B1
(45) Date of Patent: Jun. 18, 2002

(54) SEMICONDUCTOR DEVICE AND PROCESS FOR FORMING THE SAME

(75) Inventors: Rana P. Singh; Chi Nan Brian Li, both of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 26 days.

(21) Appl. No.: 09/664,510

(22) Filed: Sep. 18, 2000

(51) Int. Cl.[7] .......................... H01L 21/76; H01L 21/336
(52) U.S. Cl. ...................... 438/423; 438/425; 438/424; 438/296; 438/355; 438/524
(58) Field of Search .................................. 438/423, 433, 438/424, 221, 425, 296, 524, 525, 427, 294, 295, 318, 355, 353, 359

(56) References Cited

U.S. PATENT DOCUMENTS

| | | | |
|---|---|---|---|
| 4,238,278 A | | 12/1980 | Antipov ........................ 156/657 |
| 4,994,406 A | | 2/1991 | Vasquez et al. ................ 437/67 |
| 5,065,217 A | | 11/1991 | Verret ............................ 357/49 |
| 5,646,063 A | * | 7/1997 | Mehta et al. ................ 438/425 |
| 5,854,114 A | * | 12/1998 | Li et al. ........................ 438/296 |
| 5,858,830 A | | 1/1999 | Yoo et al. .................... 438/241 |
| 5,883,006 A | | 3/1999 | Iba .............................. 438/712 |
| 5,915,191 A | * | 6/1999 | Jun ............................. 438/431 |
| 6,146,970 A | * | 11/2000 | Witek et al. ................. 438/424 |
| 6,228,746 B1 | * | 12/2001 | Ibok ............................ 438/425 |

OTHER PUBLICATIONS

H. Watanabe et al., Corner–Rounded STI Technology . . . for Highly Reliable Flash Memory, IEDM 96, pp. 833–836.*
Albert Fazio, "A High Density High Performance 180nm Generation Etox™ Flash Memory Technology", 1999 IEEE, 4 pgs.

* cited by examiner

*Primary Examiner*—Matthew Smith
*Assistant Examiner*—Igwe U. Anya

(57) ABSTRACT

Semiconductor devices and processes for forming the same. The semiconductor device includes field isolation regions within trenches lying within a semiconductor device substrate. The trenches include a first trench and a second trench. The device includes a first component region and a second component region. The first component region lies near the first trench, and the second component region lies near the second trench. The semiconductor device includes a feature selected from a group consisting of: (a) a first liner within the first trench, and a second liner within the second trench, wherein the first liner is significantly thicker than the second liner; and (b) the first component region has a first edge with a first radius of curvature near the first trench, and the second component has a second edge with a second radius of curvature near the second trench, wherein the first radius of curvature is significantly greater than the second radius of curvature.

11 Claims, 3 Drawing Sheets

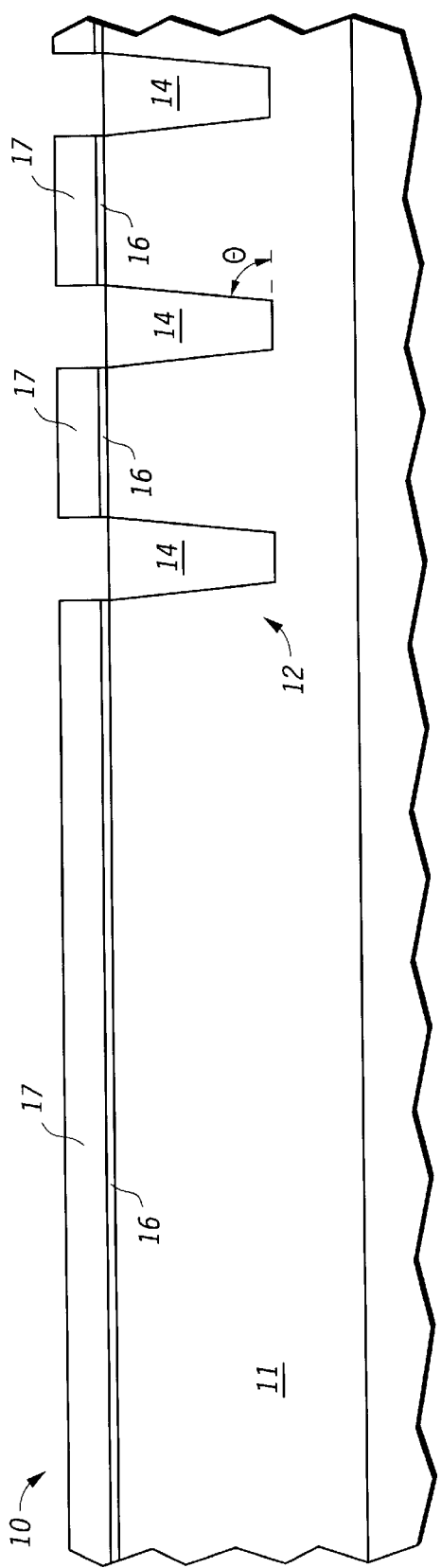
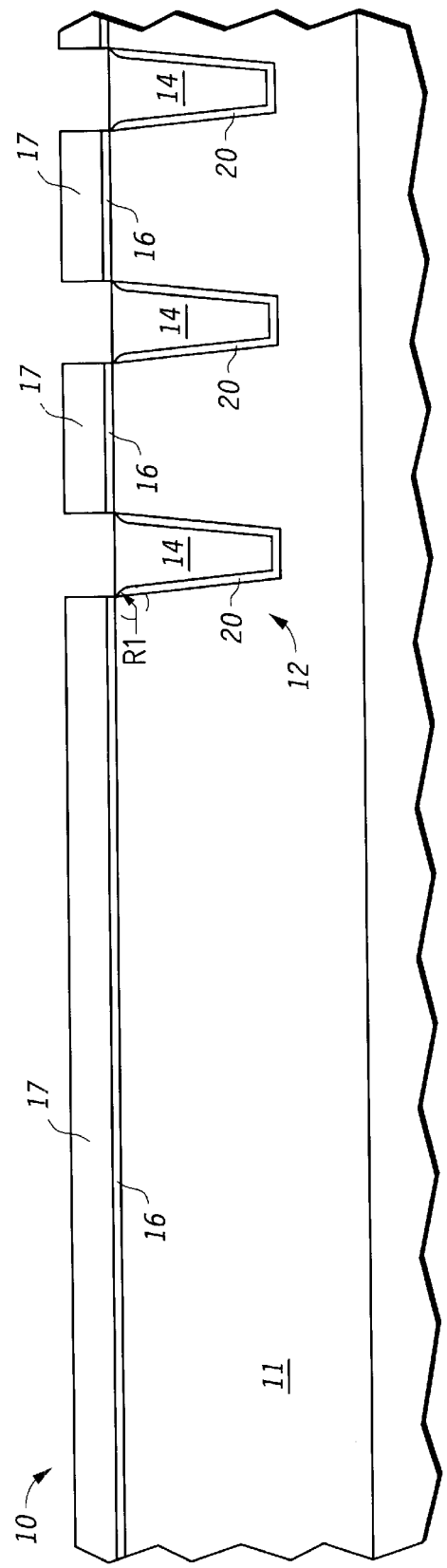

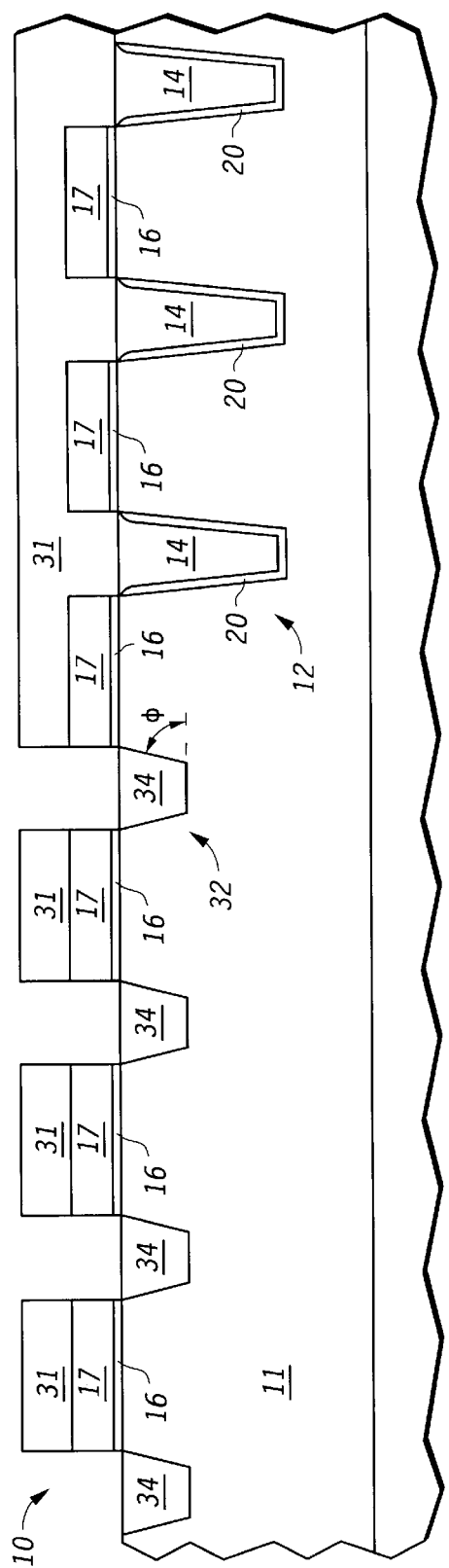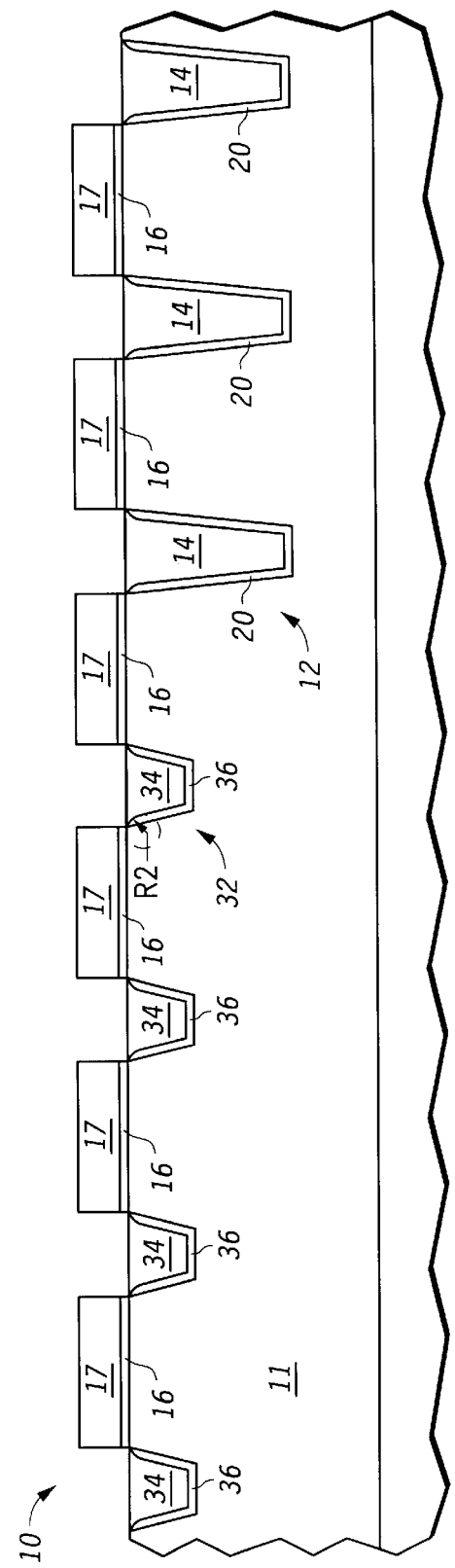

SEMICONDUCTOR DEVICE AND PROCESS FOR FORMING THE SAME

FIELD OF THE INVENTION

The present invention relates generally to the fields of semiconductor devices and processing. Particularly, it concerns semiconductor devices, and processes for forming the same, that involve field isolation regions. Even more particularly, it concerns semiconductor devices, and processes for forming the same, that involve two or more field isolation regions having different characteristics on the same chip.

BACKGROUND OF THE INVENTION

Integrated circuit fabrication usually requires that individual active and passive circuit elements be electrically isolated from one another. The isolation allows for circuit connections to be made with patterned surface metallization, the isolated circuit elements being in contact with that metallization. Many diverse techniques have been proposed to achieve effective field isolation, ranging from junction isolation, dielectric isolation, and combinations thereof. Although each technique has its advantages, shortcomings nevertheless remain.

As more functional elements are placed on a single chip, it becomes difficult to manufacture isolation regions that satisfy the needs of each functional element. This is especially true when each function element requires isolation constraints. In particular, for a system-on-a-chip solution, both logic and memory devices may be present on a single chip. In this case, it may be particularly difficult to manufacture satisfactory isolation regions for each device type. Specifically, though both logic and memory devices require a large device densities, the isolation requirements for the two devices may be quite different.

For instance, memory devices often require trenches with rounded trench corners while logic devices often require narrow isolation, with the rounded nature of the corners being less important. Memory devices typically require rounded trench corners to avoid electrical field enhancement at the trench corners during program and erase steps. The enhanced fields are sought to be avoided because they may lead to several problems including, but not limited to the reduction of bit cell endurance and reliability. In contrast to the requirements of memory devices, logic devices typically do not require trench-corner rounding, or not to the degree necessary in memory devices. Thus, as may be seen in this one example, the field isolation requirements for a single chip may be quite varied. This variation, in turn, creates manufacturing difficulties especially since tradition isolation techniques process all different isolation regions similarly, if not identically. Thus, using traditional techniques, it is difficult or impossible to custom tailor different field isolation regions upon a single chip.

One existing technique to produce rounded trench corners involves growing a thick trench liner oxide at high temperature. A thick trench oxide liner produces trench corners with varying degrees of curvature; however, it is common for a thicker liner to also grow into the trench spacing itself. This growth within the trench may unfortunately reduce the gap distance between the trench walls, which increases the aspect ratio of the trenches that need to be filled by a trench fill oxide process. As the aspect ratio increases, it becomes more difficult to fill the trench, and the likelihood of imperfections in the trench increases.

As long as the spacing between the active regions is as large as it is in memory devices typically available today, trench liner thicknesses do not usually degrade the trench fill process. However, with increasing circuit densities in logic circuits likely to be seen in near-future devices, it will become increasingly more difficult to fill narrow trenches that have thick trench liners. In particular, attempts to fill such narrow trenches may lead to increased occurrence of voids (spaces within the trench that are not adequately filled by an insulator), which are problematic for many reasons. For instance, voids can cause electrical shorts during subsequent processing steps. Further, voids can collect polishing residue during polishing steps, which can lead to an entirely different set of problems. Voids can also collect excessive moisture, which leads to other problems. Finally, voids may collect one or more conducting materials from subsequent processing steps, which may also cause shorts.

Although generally recognizing certain problems associated with filling trenches—the difficulty in filling narrow trenches and the inability to process isolation regions differently on a single chip—existing technology nevertheless utilizes single trench integration methods. Single trench integration methods, although such methods may exhibit at least a degree of utility in solving certain problems in the art, the specific problems mentioned above generally remain. Therefore, it would be advantageous to provide for the ability to create different isolation regions trenches having different characteristics (such as depth, corner rounding, etc.) on a single chip. This ability would provide for the effective de-coupling of, for instance, the isolation regions for logic and memory devices on a single chip. Having such an ability, both logic and memory devices may be adequately filled without the formation of voids using a standard oxide process or any CVD oxide fill process.

Problems enumerated above are not intended to be exhaustive, but rather are among many that tend to impair the effectiveness of previously known devices and techniques concerning isolation regions. Other noteworthy problems may also exist; however, those presented above should be sufficient to demonstrate that methodology appearing in the art have not been altogether satisfactory. In particular, existing techniques do not adequately account for the need for different types of devices to require different types of isolation. Because existing techniques process isolation regions together, it is difficult, if not impossible to form isolation regions with different characteristics on a single chip. That being the case, one or more isolation regions are often inadequately formed; for instance, one or more trench regions may be difficult or impossible to fill without the formation of voids. The voids, in turn, may have adverse affects on device performance.

BRIEF DESCRIPTION OF THE DRAWINGS

The present invention is illustrated by way of example and not limitation in the accompanying figures, in which like references indicate similar elements, and in which:

FIG. 1 shows a semiconductor device including first isolation regions within trenches lying within a semiconductor device substrate;

FIG. 2 shows the semiconductor device of FIG. 1, also including liners within the trenches;

FIG. 3 shows the semiconductor device of FIG. 2, also including second isolation regions within trenches having different characteristics than the trenches of the first set of isolation regions shown in FIG. 1. Also shown is a photoresist layer used to effectively de-couple the first and second isolation regions from one another.

FIG. 4 shows the semiconductor device of FIG. 3, also including liners within the trenches;

Figure 5:
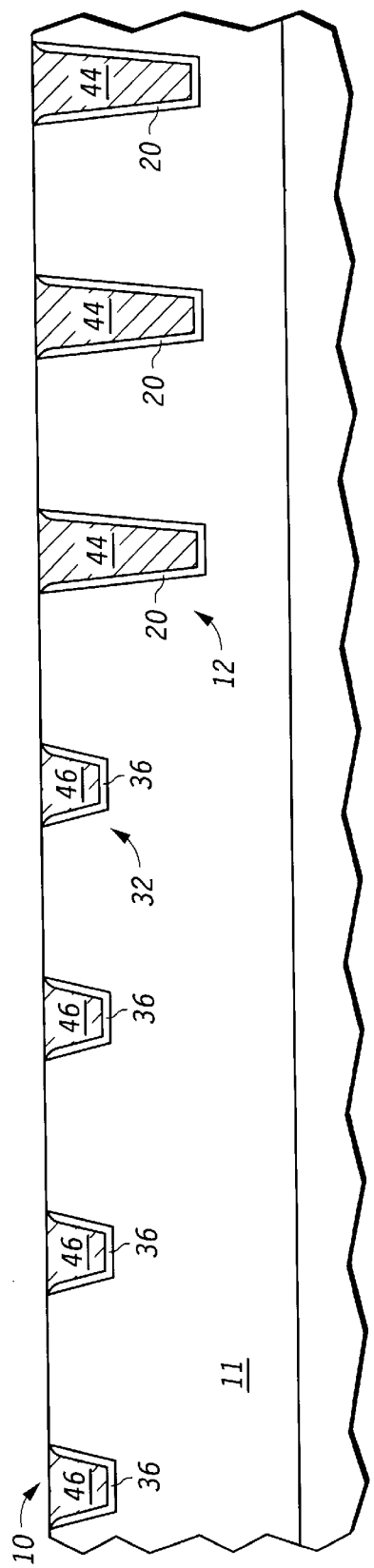
FIG. 5 shows the semiconductor device of FIG. 4, the trenches having been filled with an insulator.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DESCRIPTION OF ILLUSTRATIVE EMBODIMENTS

In one respect, the invention is a semiconductor device including field isolation regions, a first component region, and a second component region. The field isolation regions are within trenches lying within a semiconductor device substrate. The trenches include a first trench and a second trench. The first component region lies near the first trench, and the second component region lies near the second trench. The semiconductor device includes a feature selected from a group consisting of: (a) a first liner within the first trench, and a second liner within the second trench, wherein the first liner is significantly thicker than the second liner; and (b) the first component region has a first edge with a first radius of curvature near the first trench, and the second component has a second edge with a second radius of curvature near the second trench, wherein the first radius of curvature is significantly greater than the second radius of curvature.

In another respect, the invention concerns a process for forming a semiconductor device. Trenches are formed to define a first component region and a second component region. The trenches include a first trench and a second trench. The first component region lies near the first trench, and the second component region lies near the second trench. A first liner is formed within the first trench, a second liner is formed within the second trench. The semiconductor device includes a feature selected from a group consisting of: (a) the first liner is significantly thicker than the second liner; and (b) the first component region has a first edge with a first radius of curvature near the first trench, and the second component has a second edge with a second radius of curvature near the second trench, wherein the first radius of curvature is significantly greater than the second radius of curvature.

Turning first to FIG. 1, there is shown a semiconductor device 10 according to one embodiment of the present disclosure. Shown is a substrate 11, first trenches 14, a first isolation region generally shown as 12 (and corresponding to first trenches 14), a pad oxide 16, and a pad nitride 17. In one embodiment, substrate 11 may include a monocrystalline semiconductor wafer, a semiconductor on insulating wafer, or any other substrate used for forming semiconductor devices. In one embodiment, pad oxide 16 may have a thickness between about 100–160 angstroms, but it is understood that this thickness can very greatly. In another embodiment, pad oxide 16 may have a thickness of about 145 angstroms. Pad oxide 16 may be thermally grown as is known in the art or by any other suitable manner. In one embodiment, pad nitride 17 may have a thickness between about 800–2000 angstroms, but it is understood that this range may vary widely as well. Pad nitride layer 17 may be a single layer or a composite layer. In particular, pad nitride 17 may include silicon-rich nitride, silicon nitride, silicon oxynitride, or any combination thereof. In one embodiment, pad nitride 17 may include a lower film of silicon-rich nitride, which may be about 200 angstroms covered by a $Si_3N_4$ layer having a thickness of about 1200 angstroms.

First trenches 14 may be formed by a variety of different methodologies as is known in the art. For instance, trenches 14 may be formed by using a resist layer mask, followed by etching through pad nitride 17, pad oxide 16, and portions of substrate 11 to form the trenches. The depth of first trenches 14 may vary significantly depending upon the type of device being built. However, in one embodiment, trenches 14 may have a depth between about 2000 to about 7000 angstroms. Associated with first trenches 14 is angle theta. As illustrated, angle theta is defined by an angle formed by the sidewall of trenches 14 and the bottom of trenches 14. Although the value of angle theta may vary significantly according to the device being built, in one embodiment, theta may be equal to or more than about 70 degrees. In another embodiment, theta may be between about 30 and about 70 degrees. To change angle theta, one or more processing parameters may be varied as is known in the art. For instance, parameters of reactive ion etching may be adjusted to achieve a desirable angle theta or shape of trenches 14.

Turning next to FIG. 2, there is shown semiconductor device 10, also including first trench liners 20. First trench liners 20 may be formed by any one of several methodologies known in the art. For instance, first trench liners 20 may be formed by first "undercutting," or etching, a portion of pad oxide layer 16. This may be accomplished by placing semiconductor device 10 in a suitable etching solution as known in the art. In one embodiment, that solution may include a diluted mixture of HF. Specifically, semiconductor device 10 may be dipped in a solution including 100:1HF. Specifically, in such an embodiment, the semiconductor device 10 may be subjected to the HF solution for a time sufficient to etch pad oxide 16 to a degree equivalent to a 200 angstrom thickness oxide etch removal from a test wafer.

The thickness of first trench liners 20 may vary significantly. However, in one embodiment first trench liners 20 may be between about 200 and about 900 angstroms. More particularly, in one embodiment the first trench liners 20 may be about 400 angstroms. First trench liners 20 may be formed, subsequent to the undercutting etch mentioned above, by subjecting semiconductor device 10 to thermal oxidation at a temperature range between about 960–1100 degrees Celsius. In one embodiment, the temperature may be about 1100 degrees Celsius. As is known in the art, the thickness of first trench liners 20 may be determined through reference to a test wafer.

With reference to FIG. 2, it may be seen that the isolation region of semiconductor device 10 includes an edge having a radius of curvature labeled R. Radius of curvature R is associated with the rounded corner of first trench liners 20. The corners of first trench liners 20 may be made to be round by techniques known in the art. The degree of rounding may be adjusted by various techniques. For instance, changes in temperature, changes in the degree to which pad oxide 16 is undercut, and changes in the thickness of the first trench liners 20 may all be adjusted so as to modify the radius of curvature R.

Turning next to FIG. 3, there is shown semiconductor device 10 also including resist layer 31, second isolation region generally shown as 32, and second trenches 34. Resist layer 31 may be first patterned as is known in the art. In particular, resist layer 31 may be coated and developed to form the desired second isolation region pattern. After patterning, reactive ion etching, or any other etching methodology known in the art may be used to remove portions of pad nitride layer 17, pad oxide layer 16, and substrate 11 according to the pattern developed in the resist layer 31 to form second trenches 34.

The depth of second trenches 34 may vary significantly depending upon the type of devices being built. However, in one embodiment, trenches 34 may have a depth between about 2000 to about 7000 angstroms. Associated with second trenches 34 is angle phi. As illustrated, angle phi is defined by an angle formed by the sidewall of trenches 34 and the bottom of trenches 34. Although the value of phi may vary significantly according to the device being built, in one embodiment, theta may be equal to or greater than about 70 degrees. In another embodiment, phi may be between about 30 to 70 degrees. To change angle phi, one or more processing parameters may be varied as is known in the art. For instance, reactive ion etching parameters may be adjusted to achieve a desirable angle theta or shape of trenches 34. Subsequent to the formation of second trenches 34, resist mask layer 31 is removed by any one of several methods known in the art.

With reference to FIG. 3, several advantages of the present disclosure may be seen. As illustrated, semiconductor device 10 includes two different isolation regions, indicated generally by 12 and 32. Within each region are a set of trenches, trenches 14 and 34. Due to the fact that the first isolation region was formed prior to, and independent from, the second isolation region. those two isolation regions may be deemed to have been de-coupled. In other words, the formation of the first isolation region 12 and its associated trenches 14 need not affect the formation of the second isolation regions and its associated trenches 34. In the illustrated embodiments, this de-coupling is made possible, in part, due to the order of processing steps and the use of resist mask layer 31. In particular, resist layer 31 effectively masks the first isolation region while the second region is being formed. Thus, the two regions may be designed so that they each have starkly different characteristics, if so desired.

In particular, due to the de-coupling of the isolation regions, one may form first trenches 14 so that they have a different depth, width or shape as compared to second trenches 34. More particularly, trenches 34 may be formed to correspond to isolation for logic devices while trenches 14 may be formed to correspond to isolation for memory devices, which often require deeper or shallower trenches with rounded trench corners. Due to the de-coupling, angles theta and phi may be made to be significantly different. In one embodiment, angle theta may be about 70 degrees while angle phi may be about 30 degrees.

Turning now to FIG. 4,there is shown semiconductor device 10, also including second trench liners 36. Second trench liners 36 may be formed by any one of several methodologies known in the art. For instance, second trench liners 36 may be formed by first "undercutting," or etching, a portion of pad oxide layer 16. This may be accomplished by placing semiconductor device 10 in a suitable etching solution as known in the art. In one embodiment, that solution may include a diluted mixture of HF. Specifically, semiconductor device 10 may be dipped in a solution including 100:1HF. Specifically, in such an embodiment, the semiconductor device 10 may be subjected to the HF solution for a time sufficient to etch pad oxide 16 to a degree equivalent to a 200 angstrom thickness oxide etch removal from a test wafer.

The thickness of second trench liners 36 may vary significantly. However, in one embodiment second trench liner 36 may be between about 200 and about 900 angstroms. More particularly, in one embodiment the second trench liners 36 may be about 100 angstroms. In another embodiment, the second trench liners 36 may be between about 0 to about 400 angstroms. Second trench liners 36 may be formed, subsequent to the undercutting the pad oxide by above mentioned wet etch, by subjecting semiconductor device 10 to thermal oxidation at a temperature range between about 960–1100 degrees Celsius. In one embodiment, the temperature may be about 1000 degrees Celsius. As is known in the art, the thickness of second trench liners 36 may be determined through reference to a test wafer.

Those having skill in the art understand that in forming second trench lines 36, the thickness of first trench liners 20 may be slightly affected. In particular, during the thermal oxidation steps used to form trench lines 36, trench liners 20 may undergo further, albeit slight, oxidation so that liners 20 may be thickened. Although this is an example of slight coupling between the first and second isolation regions (the thicknesses of liners 20 not being totally independent from the thicknesses of liners 36), those having skill in the art understand that this coupling is indeed slight and still allows for the tremendous advantages that are provided by the ability to form two or more different isolation regions having different trench characteristics.

For instance, with reference to FIGS. 2 and 4, it may be seen that the independence, or de-coupling, of the two isolation regions allows for the formation of two different radiuses of curvature. In particular, radius R2 of FIG. 4 may be made to be different that radius of curvature R1 of FIG. 2. The difference in radiuses may be made arbitrarily large or small be adjusting process parameters governing the corner rounding of the trench liners, but in one embodiment the difference may be 70 percent. Specifically, in one embodiment, R1 may be about 70 percent larger than R2. Not only may their associated angles be made to be different, but also their thicknesses may be made to vary. In particular, by adjusting the processing conditions during formation of liners 36, liners 36 may be made thicker than liners 20. In one embodiment, the difference in thicknesses between liners 20 and 36 may be about 5 percent. In other embodiments, this difference may be arbitrarily smaller or larger.

The ability to form different trenches upon the same substrate with significantly different thicknesses of liners is very advantageous. As mentioned earlier, one problem facing the field of isolation is that liners may make it difficult, if not impossible to adequately fill trenches. In particular, if a liner is too thick, it may reduce the width of a trench to a degree to which filling without the formation of voids becomes unlikely. This problem can occur, however, when trying to fabricate different types of devices upon a single substrate (for example, for "system on a chip" (SOC) applications); if thicker trench liners are required for a certain class of devices, the liners for other classes of devices will necessarily be thick as well because the isolation process is coupled—what is done to one group of isolation regions is done to another. In contrast, the present disclosure allows for the de-coupling of isolation formation so that, for instance, memory and logic devices can be formed side by side despite the different requirements each has with regard to trench isolation.

Turning now to FIG. 5, there is shown semiconductor device 10 having first and second trenches 14 and 34 filled with an insulating material to form first filled trench 44 and second filled trench 46. In one embodiment, an oxide material may be used to fill these trenches. In other embodiments, any other type of insulating material may be used as is known in the art. In FIG. 5, it may be seen that pad nitride layer 17 and pad oxide layer 16 have been removed. These removal steps may be performed by any one of several techniques known in the art. Subsequent to the filling of the first and second trenches, one or more densification steps may be undertaken, as is known in the art.

As is known in the art, semiconductor device 10 shown in FIG. 5 may be subjected to one or more polishing steps to achieve a planar surface. Due to the independent controllability of the different trenches, the filling steps illustrated herein are more likely to result in completely filled isolation trenches with no voids. In particular, different trenches in different isolation regions may be formed so that complete, void-free filling may be achieved.

Figure 6:
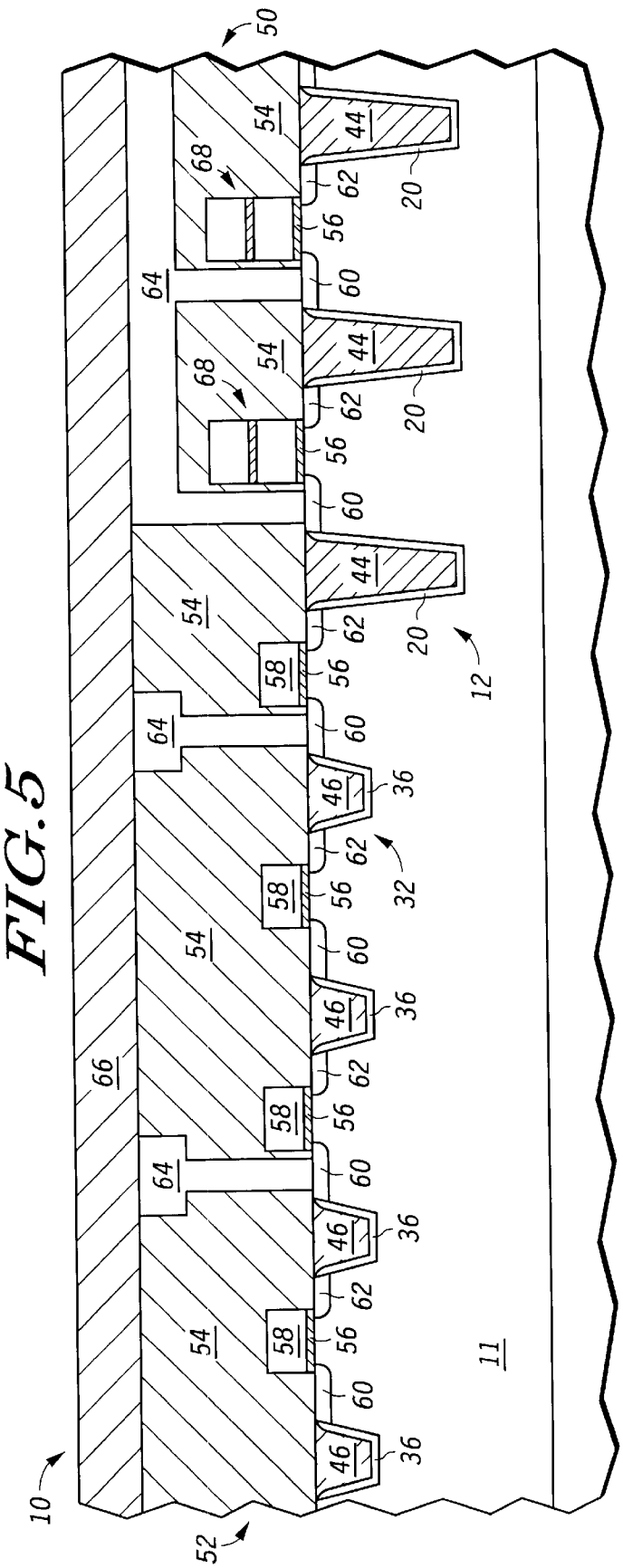
FIG. 6 shows the semiconductor device of FIG. 5, also including a first and second component region corresponding to the first and second isolation regions.

Turning next to FIG. 6, there is shown semiconductor device 10 including a first component region shown generally as 50 and a second component region shown generally as 52. These component regions simply refer to components associated with the isolation regions described herein. In particular, first component region 50 corresponds to all components that are part of first isolation region 12 and isolated by first isolation trenches 14 (or filled trenches 44). Second component region 52 corresponds to all components that are part of second isolation region 32 and isolated by second isolation trenches 34 (or filled trenches 46).

In the illustrated embodiment, first component region 50 corresponds to a memory array portion of an integrated circuit device while second component region 52 corresponds to a CMOS logic portion of the integrated circuit device. Shown in FIG. 6 are dielectric layer 54, passivation layer 66, and conducting layer 64, which may be any conductor such as a metal. As illustrated, conducting layer 64 may connect to source and/or drain regions of the CMOS logic portion. The source and drain regions are illustrated as 60 and 62, respectively. Also shown are gate 58 and gate oxide 56. Logic portion 52 and memory array 50 may also have different power supply potentials which have non-zero absolute values. These different power supply voltages may be utilized to improve the operating characteristics of the two different kinds of circuits. Those having skill in the art recognize that all of the elements shown in FIG. 6 may be formed by methodology well known in the art, and for that reason, will not be repeated here.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for forming semiconductor device comprising:
    forming trenches to define a first component region and a second component region, wherein:
    the trenches include a first trench and a second trench; and
    the first component region lies near the first trench; and
    the second component region lies near the second trench;
    forming a first liner within the first trench; and
    forming a second liner within the second trench,
    wherein the semiconductor device includes a feature selected from a group consisting of:
        the first liner is significantly thicker than the second liner; and
        the first component region has a first edge with a first radius of curvature near the first trench, and the second component region has a second edge with a second radius of curvature near the second trench, wherein the first radius of curvature is significantly greater than the second radius of curvature.

2. The process of claim 1, wherein:
    the first liner is significantly thicker than the second liner; and
    the first radius of curvature is significantly greater than the second radius of curvature.

3. The process of claim 1, wherein the semiconductor device is designed to operate at a first power supply potential and a second power supply potential, wherein:
    each of the first and second power supply potentials has non-zero absolute value; and
    the first and second power supply potentials are significantly different from each other.

4. The process of claim 1, wherein:
    the first trench has a first depth;
    the second trench has a second depth; and
    the first and second depths are significantly different from each other.

5. The process of claim 1, wherein:
    each of the first and second trenches has a sidewall and a bottom; and
    a first angle is defined by an angle formed by the sidewall and the bottom within the first trench;
    a second angle is defined by an angle formed by the sidewall and the bottom within the second trench; and
    the first angle is significantly different than the second angle; and
    the first angle is greater than approximately 70 degrees.

6. The process of claim 1, wherein the first liner is at least approximately five percent thicker than the second liner.

7. The process of claim 1, wherein the first radius of curvature is at least approximately 70 percent larger than the second radius of curvature.

8. The process of claim 1, wherein:
    the semiconductor device includes a memory array portion and a logic portion;
    the memory portion includes the first component region and the first liner;
    the logic array portion includes:
        a second trench having a different depth than a first trench;
        a second component region having a second radius of curvature that is significantly smaller than the first radius of curvature; and
        a second liner that is significantly thinner than the first liner.

9. The process of claim 8, further comprising a field channel stop doped region along a bottom of the second trench or the first trench.

10. The process of claim 1, wherein:
   forming the first liner is performed at a first temperature; and
   forming the second liner is performed at a second temperature that is significantly different than the first temperature.

11. The process of claim 1, further comprising:
   forming a dielectric layer over the first and second trenches and the first and second component regions;
   forming an interconnect lying at least partially within the dielectric layer; and
   forming a passivation layer over the dielectric layer and the interconnect.

* * * * *